(12) United States Patent
Nishimura et al.

(10) Patent No.: US 9,860,468 B2
(45) Date of Patent: Jan. 2, 2018

(54) SOLID-STATE IMAGE PICKUP DEVICE, AND IMAGE PICKUP DEVICE WHICH PROVIDES FOR ENHANCED IMAGE QUALITY

(71) Applicant: Panasonic Intellectual Property Management Co., Ltd., Osaka (JP)

(72) Inventors: Kazuko Nishimura, Kyoto (JP); Yutaka Abe, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/200,108

(22) Filed: Jul. 1, 2016

(65) Prior Publication Data

US 2016/0316168 A1 Oct. 27, 2016

Related U.S. Application Data

(63) Continuation of application No. PCT/JP2015/000024, filed on Jan. 7, 2015.

(30) Foreign Application Priority Data

Jan. 22, 2014 (JP) ................................ 2014-009878

(51) Int. Cl.
*H04N 5/3745* (2011.01)
*H03M 1/12* (2006.01)
(Continued)

(52) U.S. Cl.
CPC .......... *H04N 5/37455* (2013.01); *H03M 1/12* (2013.01); *H04N 5/3658* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 2010/0020217 A1 | 1/2010 | Abe et al. | |
| 2012/0194261 A1* | 8/2012 | Rysinski | H03F 3/45188 327/534 |

(Continued)

FOREIGN PATENT DOCUMENTS

| | | |
|---|---|---|
| JP | 2009-118035 | 5/2009 |
| JP | 2010-034616 | 2/2010 |

(Continued)

OTHER PUBLICATIONS

International Search Report of PCT application No. PCT/JP2015/000024 dated Mar. 24, 2015.

*Primary Examiner* — Justin P Misleh
(74) *Attorney, Agent, or Firm* — McDermott Will & Emery LLP

(57) ABSTRACT

A solid-state image pickup device includes: a pixel portion in which a plurality of pixels are arrayed in matrix; and an Analog-Digital converter. The Analog-Digital converter converts pixel signals, which are generated in the pixel portion, from analog signals into digital signals. The Analog-Digital converter includes: a comparator; and a counter. The comparator compares the analog signals, each of which corresponds to each of the plurality of pixels, with a reference signal. The comparator includes: a first differential transistor to which the reference signal is input; a second differential transistor to which the analog signals are input; a first load transistor; a second load transistor; and a current source transistor. A fluctuation of a voltage between a gate and a source of the first differential transistor is suppressed. This fluctuation follows a voltage fluctuation of a node (Continued)

connected commonly to the second differential transistor and the second load transistor.

7 Claims, 5 Drawing Sheets

(51) Int. Cl.
*H04N 5/378* (2011.01)
*H04N 5/365* (2011.01)

(56) References Cited

U.S. PATENT DOCUMENTS

| | | |
|---|---|---|
| 2013/0215302 A1 | 8/2013 | Ueno |
| 2013/0215303 A1* | 8/2013 | Ueno .................. H03K 5/08 |
| | | 348/300 |
| 2014/0232916 A1 | 8/2014 | Nagai et al. |
| 2016/0205333 A1* | 7/2016 | Shishido ............. H04N 5/378 |
| | | 348/308 |
| 2016/0309100 A1* | 10/2016 | Abe .................... H04N 5/363 |

FOREIGN PATENT DOCUMENTS

| | | |
|---|---|---|
| JP | 2013-168880 | 8/2013 |
| WO | 2013/057903 | 4/2013 |

* cited by examiner

SOLID-STATE IMAGE PICKUP DEVICE, AND IMAGE PICKUP DEVICE WHICH PROVIDES FOR ENHANCED IMAGE QUALITY

RELATED APPLICATIONS

This application is a Continuation of International Application No. PCT/JP2015/000024, filed on Jan. 7, 2015, which in turn claims priority from Japanese Patent Application No. 2014-009878, filed on Jan. 22, 2014, the contents of all of which are incorporated herein by reference in their entireties.

BACKGROUND

1. Field of the Invention

The present disclosure relates to a solid-state image pickup device and an image pickup device.

2. Description of Related Art

With reference to FIG. 8, a description is made below of a solid-state image pickup device (CMOS image sensor) disclosed in Unexamined Japanese Patent Publication No. 2013-168880.

FIG. 8 is a block configuration diagram of a conventional solid-state image pickup device disclosed in Unexamined Japanese Patent Publication No. 2013-168880. Solid-state image pickup device 500 disclosed in FIG. 8 includes: image pickup region 510 in which pixels are two-dimensionally arrayed in XY directions; row selection circuit 520 as a pixel driver; horizontal scanning circuit 530; timing control circuit 540; AD (Analog-Digital) converter group 550; digital-analog converter 560 as a reference signal generation circuit (ramp signal generator); amplifier circuit 570 for signal output; signal processing circuit 580; and horizontal transfer line 590. AD converter group 550 has a configuration in which AD converters, each including comparator 551, counter 552 and latch circuit 553, are arrayed for each of columns.

Each of comparators 551 compares ramp voltage $V_{slope}$ with analog signals. The ramp voltage $V_{slope}$ has a stepped ramp waveform output from digital-analog converter 560 through ramp signal line 555. The analog signals are output from the pixels via vertical signal lines 554 for each of row lines. Each of counters 552 counts a comparison time of comparator 551. By the above-described operations of comparators 551 and counters 552, AD converter group 550 outputs pixel signals as digital data. Such an ADC system as described above is referred to as a single-slope column-parallel ADC system.

SUMMARY

A solid-state image pickup device according to an aspect of the present disclosure includes: a pixel portion in which a plurality of pixels performing photoelectric conversion are arrayed in matrix; and an Analog-Digital converter that converts pixel signals, which are generated in the pixel portion, from analog signals into digital signals. The Analog-Digital converter includes a comparator and a counter. The comparator is disposed for each of pixel columns and compares the analog signals, each of which corresponds to each of the plurality of pixels, with a reference signal. The counter is disposed so as to correspond to the comparator and obtains the digital signals by counting periods during which the comparator compares the analog signals with the reference signal. The comparator includes: a first differential transistor to which the reference signal is input; a second differential transistor to which the analog signals are input; a first load transistor; a second load transistor; and a current source transistor. The first load transistor is connected between a drain terminal of the first differential transistor and a power supply. The second load transistor is connected between a drain terminal of the second differential transistor and the power supply. The current source transistor is connected between a ground and source terminals of the first differential transistor and the second differential transistor. A ratio between gate width/gate length of the first differential transistor and gate width/gate length of the second differential transistor is 1:N (N>1).

In accordance with this configuration, a capacitance of a drain of the second differential transistor is increased without changing a size of the first differential transistor that connects to the reference signal, that is, without increasing a capacitance between a gate and a source of the first differential transistor. Hence, a temporal fluctuation between the gate and the source of the first differential transistor is relieved, whereby it becomes possible to suppress the streaking without deteriorating noise characteristics.

Moreover, in the solid-state image pickup device according to the aspect of the present disclosure, a ratio between gate width/gate length of the first load transistor and gate width/gate length of the second load transistor is M:1 (M>1).

In accordance with this configuration, a current flowing through the second differential transistor is decreased from ½ of a current flowing through the current source transistor to 1/(1+M)(M>1). Hence, a temporal change of the current flowing through the first differential transistor is suppressed, and it becomes possible to suppress the streaking.

Moreover, a solid-state image pickup device according to the aspect of the present disclosure includes: a pixel portion in which a plurality of pixels performing photoelectric conversion are arrayed in matrix; and an Analog-Digital converter that converts pixel signals, which are generated in the pixel portion, from analog signals into digital signals. The Analog-Digital converter includes a comparator and a counter. The comparator is disposed for each of pixel columns and compares the analog signals, each of which corresponds to each of the plurality of pixels, with a reference signal. The counter is disposed so as to correspond to the comparator and obtains the digital signals by counting periods during which the comparator compares the analog signals with the reference signal. The comparator includes: a first differential transistor to which the reference signal is input; a second differential transistor to which the analog signals are input; a first load transistor; a second load transistor; and a current source transistor. The first load transistor is connected between a drain terminal of the first differential transistor and a power supply. The second load transistor is connected between a drain terminal of the second differential transistor and the power supply. The current source transistor is connected between a ground and source terminals of the first differential transistor and the second differential transistor. A ratio between gate width/gate length of the first load transistor and gate width/gate length of the second load transistor is M:1 (M>1).

In accordance with this configuration, a current flowing through the second differential transistor is decreased from ½ of a current flowing through the current source transistor to 1/(1+M)(M>1). Hence, a temporal change of the current flowing through the first differential transistor is suppressed, and it becomes possible to suppress the streaking.

Moreover, a solid-state image pickup device according to the aspect of the present disclosure includes: a pixel portion in which a plurality of pixels performing photoelectric conversion are arrayed in matrix; and an Analog-Digital converter that converts pixel signals, which are generated in the pixel portion, from analog signals into digital signals. The Analog-Digital converter includes a comparator and a counter. The comparator is disposed for each of pixel columns and compares the analog signals, each of which corresponds to each of the plurality of pixels, with a reference signal. The counter is disposed so as to correspond to the comparator and obtains the digital signals by counting periods during which the comparator compares the analog signals with the reference signal. The comparator includes: a first differential transistor to which the reference signal is input; a second differential transistor to which the analog signals are input; a first load transistor; a second load transistor; and a current source transistor. The first load transistor is connected between a drain terminal of the first differential transistor and a power supply The second load transistor is connected between a drain terminal of the second differential transistor and the power supply The current source transistor is connected between a ground and source terminals of the first differential transistor and the second differential transistor. A resistance component is inserted at least either between the source terminal of the first differential transistor and a drain terminal of the current source transistor or between the source terminal of the second differential transistor and the drain terminal of the current source transistor.

In accordance with this configuration, the temporal change of the current flowing through the first differential transistor is suppressed by an amount of a voltage drop in the above-described resistance component. Hence, a difference fluctuation of the voltage between the gate and the source in each of the first differential transistor and the second differential transistor is decreased, and it becomes possible to suppress the streaking.

Moreover, for example, the solid-state image pickup device further includes a switch element. The switch element is inserted at least either between the source terminal of the first differential transistor and the drain terminal of the current source transistor or between the source terminal of the second differential transistor and the drain terminal of the current source resistor. The resistance component is a resistance component in an ON state of the switch element.

In such a way, the resistance component is replaced by an ON resistance of the switch element, and accordingly, it becomes possible to suppress the streaking by means of a small area.

Moreover, for example, the resistance component includes a plurality of resistor elements connected in parallel to each other, and is capable of switching a resistance value by change in a connection state of the plurality of resistor elements.

In accordance with this configuration, in a case of picking up a dark image, requirements for the noise characteristics are severe, and accordingly, the comparator is operated by selecting a low resistance value as the above-described resistance component. Meanwhile, in a case of picking up a bright image, such streaking characteristics are conspicuous, and accordingly, it becomes possible to suppress the streaking by selecting a high resistance value as the above-described resistance component. Hence, the comparator is operated by selecting the plurality of set resistance values in response to the picked-up image, whereby it becomes possible to realize image characteristics and the streaking characteristics, which are optimum for each of the images.

Note that the present disclosure can be realized not only as the solid-state image pickup device including the characteristic configuration as described above, but also as an image pickup device including the solid-state image pickup device.

In accordance with the solid-state image pickup device and the image pickup device according to the present disclosure, the streaking can be reduced, and the image quality can be enhanced.

DETAILED DESCRIPTION OF THE EMBODIMENTS

First, a problem in the conventional technology is described. As mentioned in the Related Art, in the single-slope column-parallel ADC system describe above, each of comparators 551 compares ramp voltage $V_{slope}$, which serves as a reference potential, with a signal voltage (analog signal), which comes from the pixel, and each of counters 552 provided at the subsequent stage is controlled, whereby A/D conversion is performed. Here, such a single-slope ADC of the CMOS image sensor includes a large number of comparators 551 in a row direction in order to perform parallel processing for each of the columns and to read out the pixel signals.

Figure 8:
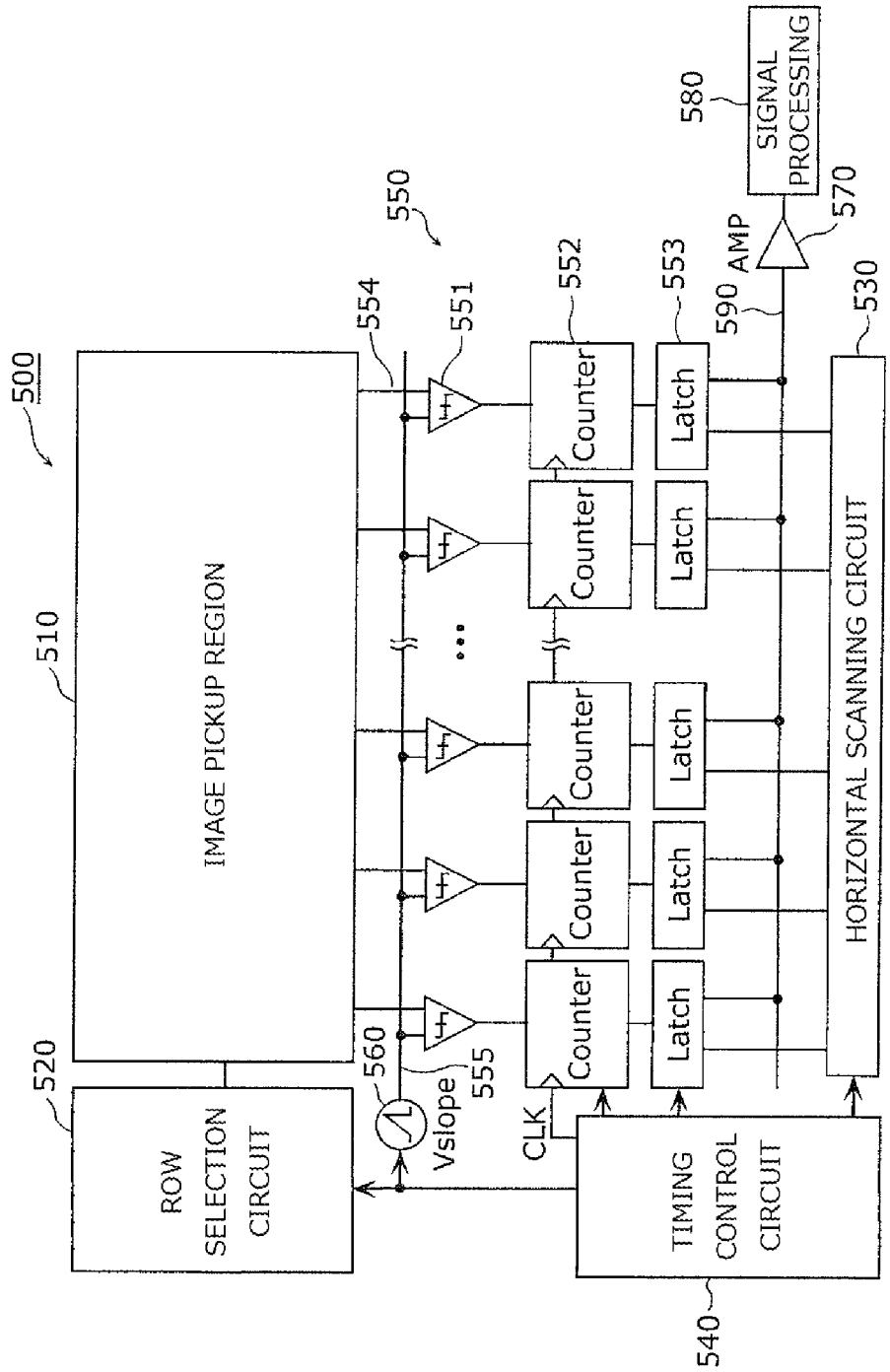
FIG. 8 is a diagram showing a block configuration of a conventional solid-state image pickup device.

The above-described ramp voltage $V_{slope}$ is commonly input through ramp signal line 555 to comparators 551 disposed in the columns. In FIG. 8, comparators 551 are all connected to ramp signal line 555. Therefore, it is assumed that an A/D conversion operation in one of comparators 551 in the columns fluctuates ramp voltage $V_{slope}$ on ramp signal line 555. In such a way, an error occurs in A/D conversion operations in other comparators 551 in the same column.

In the CMOS image sensor, in a case where there is a region in which a brightness difference is locally large in the image pickup region, the operation of one comparator in the column including the brightness difference causes such an A/D conversion error in the other comparators in the same column, and image quality is deteriorated. Hereinafter, such a phenomenon is referred to as streaking.

Specifically, the conventional solid-state image pickup device uses the single-slope column-parallel ADC system. However, in conventional solid-state image pickup device 500, as requirements for increases of a resolution and a processing speed are being increased following enhancement of camera performance, an amount of image quality deterioration (streaking), which is caused by the fluctuation of such a reference signal at a time of AD conversion response, is increased.

Exemplary embodiments of the present disclosure are made in consideration of the above-described problem, and provide a solid-state image pickup device and an image pickup device, in which the streaking is suppressed.

A description is made below of a solid-state image pickup device and an image pickup device according to the exemplary embodiments of the present disclosure while referring to the drawings. Note that the following exemplary embodiments illustrate a specific example of the present disclosure, and numeric values, shapes, materials, constituents, arrangement positions and connection forms of the constituents, steps, an order of the steps, and the like are merely examples, and do not limit the present disclosure.

First Exemplary Embodiment

[Basic Configuration of Solid-State Image Pickup Device]

Figure 1:
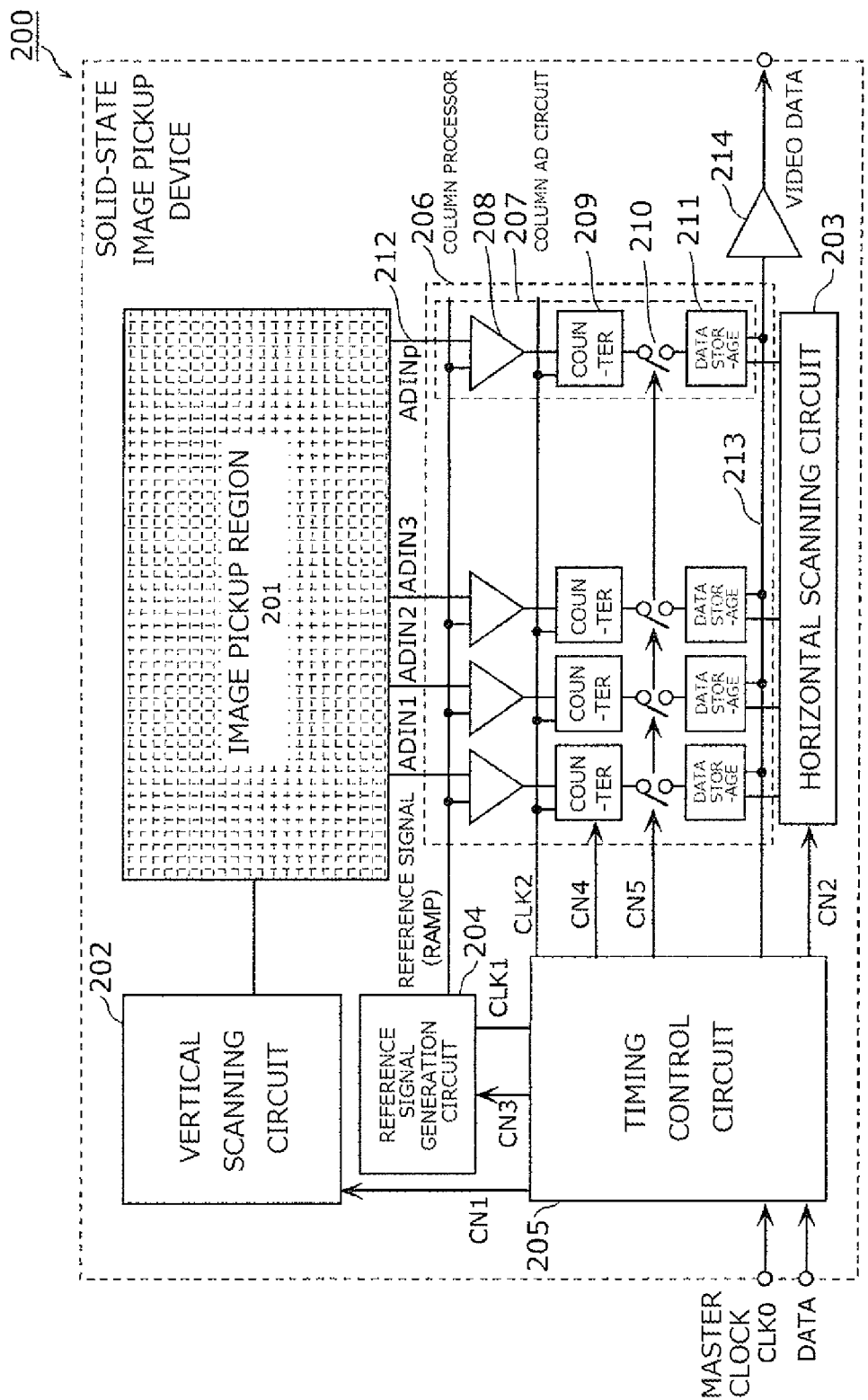
FIG. 1 is a diagram showing a block configuration of a solid-state image pickup device according to a first exemplary embodiment.

FIG. 1 is a block configuration diagram of a solid-state image pickup device according to a first exemplary embodiment. As shown in FIG. 1, solid-state image pickup device 200 according to this exemplary embodiment is an example of a CMOS image sensor, and includes: image pickup region 201; vertical scanning circuit 202; horizontal scanning circuit 203; timing control circuit 205; column processor 206; reference signal generation circuit 204; vertical signal lines 212; horizontal signal line 213; and amplifier circuit 214. Image pickup region 201 is a pixel portion in which a plurality of pixels performing photoelectric conversion are arrayed in matrix. Vertical scanning circuit 202 is a pixel driver that controls row addresses and row scanning Reference signal generation circuit 204 generates a reference signal output to comparators 208. Vertical signal lines 212 are connected to the plurality of pixels commonly for each of columns, and outputs pixel signals, which are generated in image pickup region 201, to column processor 206. Column processor 206 has a configuration in which column AD circuits 207, each including comparator 208, counter 209, switch 210, and data storage 211, are arrayed for each of columns.

[AD Conversion Operation]

Next, a description is made of an AD conversion operation of solid-state image pickup device 200. Solid-state image pickup device 200 according to this exemplary embodiment is a CMOS image sensor of a column-parallel AD conversion system. In a case of picking up a desired image by solid-state image pickup device 200, light made incident onto solid-state image pickup device 200 is converted into an electrical signal by image pickup region 201.

Image pickup region 201 is controlled per row by vertical scanning circuit 202, and the pixel signals of the respective pixels belonging to rows selected by vertical scanning circuit 202 are simultaneously output to vertical signal lines 212 connected for each of columns. In comparators 208 of the respective columns, the output pixel signals of the respective columns are individually compared with a reference signal output by reference signal generation circuit 204. Here, the reference signal is a ramp signal having a ramp voltage that has a slope (that is at least increased monotonously or decreased monotonously). A time, until which a magnitude relationship between each of the pixel signals of the columns and the reference signal is inverted, is counted by counter 209 of each column, which is connected to comparator 208 of each column. In such a way, the pixel signals of the respective columns, which are analog signals, are output as digital signals from counters 209 of the respective columns. That is to say, comparators 208 and counters 209 compose AD converter circuits, and the pixel signals of the respective columns are converted from analog signals into digital signals by the AD converter circuits of the respective columns. Column AD circuits 207 are AD converters which convert the pixel signals, which are generated in image pickup region 201, per pixel from analog signals to digital signals.

The pixel signals of the respective columns, which are converted into digital signals, pass via switches 210 of which conduction/non-conduction is switched by timing control circuit 205. Then, the pixel signals are stored and held by data storages 211 of the respective columns Sequentially from the column selected in horizontal scanning circuit 203, the signals stored and held by data storages 211 pass via horizontal signal line 213, are amplified by amplifier circuit 214, and are output to an external signal processing circuit.

Moreover, based on master clock CLK0 and data DATA for a variety of setting, timing control circuit 205 generates a variety of internal clocks collectively, and supplies the generated internal clocks to respective circuits in an inside of solid-state image pickup device 200. Specifically, timing control circuit 205 supplies vertical scanning circuit control signal CN1 to vertical scanning circuit 202, and supplies horizontal scanning circuit control signal CN2 to horizontal scanning circuit 203. Moreover, timing control circuit 205 supplies reference signal generation signal CN3 and reference signal generating clock CLK1 to reference signal generation circuit 204. Moreover, timing control circuit 205 supplies counter control signal CN4 and counter clock CLK2 to counters 209, and supplies switch control signal CN5 to switches 210. The respective circuits operate in response to these control signals.

Next, a description is made of an operation in a scene where each of the pixel signals is subjected to the AD conversion by column AD circuit 207.

Figure 2:
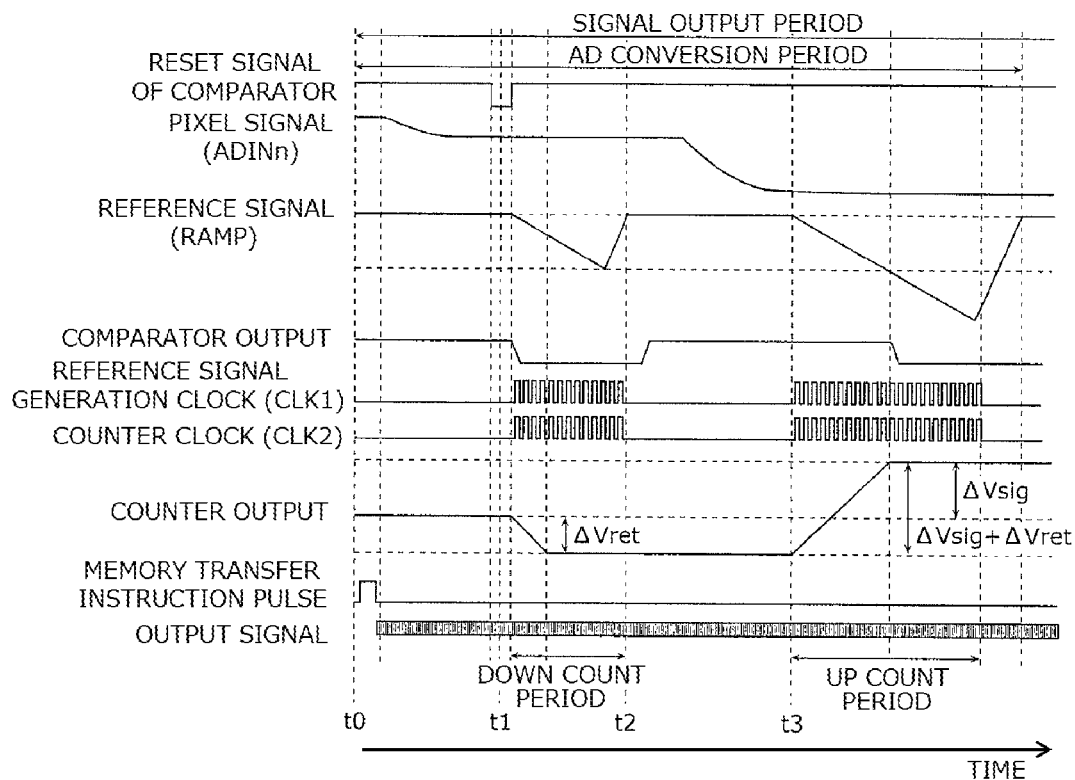
FIG. 2 is a timing chart describing an AD conversion operation of the solid-state image pickup device according to the first exemplary embodiment.

FIG. 2 is a timing chart describing the AD conversion operation of the solid-state image pickup device according to the first exemplary embodiment.

First, at time t0, timing control circuit 205 sends control signal CN4 to counters 209, resets a number of counts of counters 209 to an initial value, and sets counters 209 to a down count mode. Moreover, timing control circuit 205 sends control signal CN1 to pixels belonging to a desired row, and allows the pixels to read out reset signals, each of which has a reset component and corresponds to the pixel. The reset signals are individually output to vertical signal lines ADIN0 to ADINP.

Next, at time t1, after the reset signals of vertical signal lines 212 are stabilized, timing control circuit 205 supplies control signal CN3 and reference signal generating clock CLK1 to reference signal generation circuit 204. Upon receiving control signal CN3 and reference signal generating clock CLK1, reference signal generation circuit 204 starts to temporally change the reference signal. Simultaneously, timing control circuit 205 starts to input counter clock CLK2 to column AD circuits 207 (counters 209). Upon receiving counter clock CLK2, counters 209 start a down count from the initial value.

Here, in general, reference signal generating clock CLK1 and counter clock CLK2 are clocks obtained in such a manner that master clock CLK0 is multiplied by a constant factor by using timing control circuit 205. Note that, though it has been described that reference signal generating clock CLK1 and counter clock CLK2 operate simultaneously, such timing is merely an example, and counter clock CLK2 may be operated while being delayed in matching with a circuit operation.

After time t1, a magnitude of reference signal RAMP coincides with that of a reset signal component at a certain time. At this time, output signals of comparators 208 are inverted, and counters 209 stop the down count. The number of counts at this time is equivalent to ΔVret in FIG. 2.

Next, at time t2 when a down count period elapses, timing control circuit 205 stops the supply of control signal CN3 and reference signal generating clock CLK1 to reference signal generation circuit 204, and simultaneously, stops the supply of counter clock CLK2 to counters 209. Note that, though it has been described that reference signal generating clock CLK1 and counter clock CLK2 operate simultaneously, such timing is merely an example, and counter clock CLK2 may be stopped early in matching with the circuit operation.

Subsequently, timing control circuit 205 supplies control signal CN4 to counters 209, and sets counters 209 to an up count mode. Moreover, timing control circuit 205 supplies control signal CN1 to the pixel belonging to the desired row, and allows the pixels to read out pixel signals, each of which has signal component ΔVsig. A method of the readout is similar to that of readout of the reset components except for setting counters 209 to the up count mode.

After time t3, a magnitude of reference signal RAMP coincides with that of the pixel signals at a certain time. At this time, the output signals of comparators 208 are inverted, and counters 209 stop the up count. The number of counts at this time is equivalent to ΔVsig+ΔVret in FIG. 2.

As described above, counters 209 are set to the down count mode when reset component ΔVret is read out, and are set to the up count mode when signal component ΔVsig is read out, whereby addition and subtraction are automatically performed in counters 209. In such a way, the number of counts, which is equivalent to signal component ΔVsig, can be obtained.

Note that, though this exemplary embodiment has been described by using an up/down counter as an example of each counter 209, the addition or the subtraction may be performed at the subsequent stage by using only an up counter or only a down counter. That is to say, any configuration may be adopted as long as the number of counts, which is equivalent to signal component ΔVsig, can be obtained.

[Generation Mechanism of Streaking]

Figure 3:
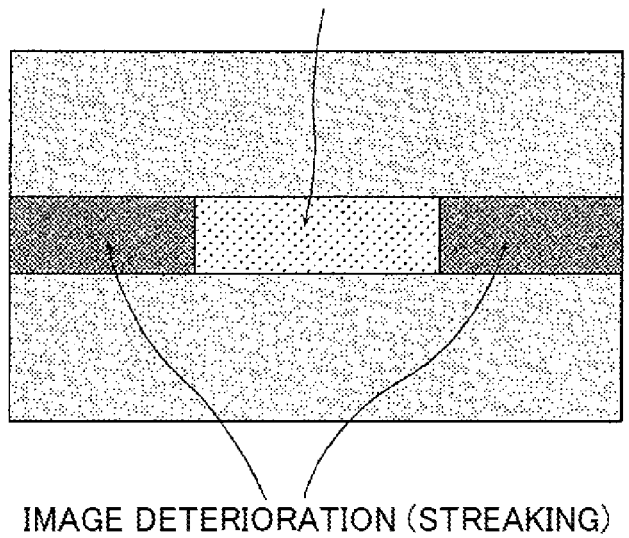
FIG. 3 is a view showing an example of an image in a case where a streaking occurs.

Here, in order to facilitate the understanding of the solid-state image pickup device according to this exemplary embodiment, a description is made of a generation mechanism of the streaking (characteristic defect) with reference to FIG. 3.

A general solid-state image pickup device including column-parallel AD convertors compares a reference signal with pixel signals of respective columns by using comparators of the respective columns, counts obtained differences by using the counters of the respective columns, and thereby performs the AD conversion. At this time, in order to cope with an increase of the processing speed, the AD conversion is performed by full-column parallel processing. Therefore, this solid-state image pickup device includes a large number of the comparators, which is equivalent to the number of horizontal pixels, in a row direction, and these comparators perform the comparison operation simultaneously. Here, the reference signal is input commonly to the comparators disposed in the row direction, and accordingly, an influence of the AD conversion operation in the comparator of a certain column propagates to the reference signal. In such a way, conversion errors occur in AD conversion values by the comparators of other columns in the same row.

FIG. 3 is a view showing an example of an image in a case where the streaking occurs. As shown in FIG. 3, in an image picked up by the CMOS image sensor, the reference signal fluctuates in a case where there is locally a region where brightness differs largely (a region where the brightness is larger than a periphery, or a region where the brightness is smaller than the periphery), and in particular, in a case where data items with same brightness continue in the row direction. This fluctuation of the reference signal is caused by a fact that inversion operations of a plurality of the comparators which determine the brightness occur simultaneously. In this case, at a time of the AD conversion in the comparators of the rest of the columns, the AD conversion is performed by using such a reference signal including a fluctuation component. As a result, output values of the AD conversion in the rest of columns become those having the conversion errors. That is to say, as shown in FIG. 3, in the image, only the output of the row concerned takes an output value different from those of other rows (that is, an output value having the conversion errors), and accordingly, a transverse stripe that does not exist in an actual picked-up image is generated, and there occurs an unallowable deterioration of the image quality. This is a streaking defect.

Here, a potential variation Vstr of the reference signal at a time when each of the comparators is inverted is represented in Formula (1) below, where R is an impedance of the reference signal, Cgs is a capacitance of a differential transistor of the comparator, ΔVgs is a voltage variation between a gate and source of the differential transistor of the comparator, and N is a number of pixels belonging to the region where the brightness differs largely, the region being adjacent to other regions in a horizontal direction.

$$\text{Vstr} \propto R \times Cgs \times \Delta Vgs \times N \tag{1}$$

In order to reduce the streaking, it is necessary to reduce the potential variation Vstr of the reference signal. From Formula 1 above, it is understood that it is effective to reduce the impedance R of the reference signal, to reduce the capacitance Cgs of the differential transistor, and to reduce the variation ΔVgs of the differential transistor.

In a case of attempting to reduce the impedance R, it is necessary to reduce an output impedance of the reference signal generation circuit composed of a current source and a resistor. However, there is a harmful effect that a current consumption, noise and an area must be increased in order to maintain a waveform of the reference signal while reducing the above-described output impedance.

Moreover, in a case of attempting to reduce the capacitance Cgs, it is conceived to reduce a size (gate capacitance) of the differential transistor of the comparator. However, when the size of the differential transistor is reduced, there is a harmful effect that random noise and RTS noise are increased to induce a deterioration of noise characteristics.

[Configuration of Comparator According to Exemplary Embodiment]

In this connection, in order to prevent the streaking while avoiding the above-described harmful effect, solid-state image pickup device 200 according to this exemplary embodiment attempts to reduce the variation ΔVgs of the voltage between the gate and source of the differential transistor of the comparator. Details of the above are described below with reference to the drawings.

Figure 4:
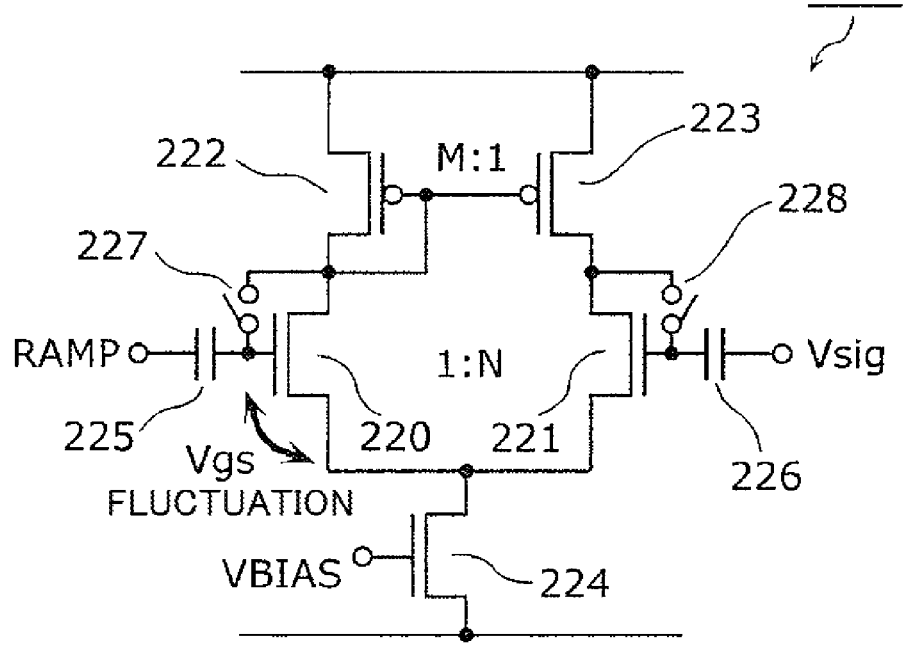
FIG. 4 is a diagram showing an example of a circuit configuration of a comparator according to the first exemplary embodiment.

FIG. 4 is a diagram showing an example of a circuit configuration of the comparator according to the first exemplary embodiment. Comparator 208A shown in FIG. 4 includes: differential transistors 220 and 221; load transistors 222 and 223; current source transistor 224; and reset switches 227 and 228.

Differential transistor 220 is a first differential transistor in which reference signal RAMP is input to a gate terminal through capacitor 225, and for example, differential transistor 220 is an n-type (NMOS) transistor. Differential transistor 221 is a second differential transistor in which pixel signal Vsig as an analog signal is input to a gate terminal through capacitor 226, and for example, differential transistor 221 is an n-type (NMOS) transistor.

Load transistor 222 is a load of differential transistor 220, and is a first load transistor, which is connected between a drain terminal of differential transistor 220 and a power supply, and in which a gate terminal and the drain terminal are connected to each other in a short-circuit manner. For example, load transistor 222 is a p-type (PMOS) transistor. Load transistor 223 is a load of differential transistor 221, and is a second load transistor, which is connected between a drain terminal of differential transistor 221 and the power supply, and in which a gate terminal and the gate terminal of load transistor 222 are connected to each other. For example, load transistor 223 is a p-type (PMOS) transistor.

Current source transistor 224 is an n-type (NMOS) transistor, which is connected between a ground terminal and source terminals of differential transistors 220 and 221, and in which a bias voltage for setting a current value is applied to a gate terminal.

Reset switches 227 and 228 are switching elements which set initial values of differential transistors 220 and 221.

In a conventional configuration, a pair of the differential transistors and a pair of the load transistors are configured in a size ratio of 1:1 for the purpose of enhancement of differential characteristics.

In contrast, in comparator 208A according to this exemplary embodiment, such symmetry is disturbed. A ratio between W/L (W is a gate width, L is a gate length) of differential transistors 220 and W/L of differential transistors 221 is set to 1:N (N>1), and a ratio between W/L of load transistors 222 and W/L of load transistors 223 is set to M:1 (M>1).

Here, in a case where differential transistor 220 operates in a saturation region, a gain coefficient B is represented by Formula (2) below, where β is a carrier mobility, Cox is a gate oxide film capacitance, W is the gate width of the transistor, L is the gate length of the transistor, and Vth is a threshold voltage.

$$\beta = \beta \times Cox \times (W/L) \tag{2}$$

From Formula (2) above, current $I_{220}$ flowing through differential transistor 220 is represented by following Formula (3).

$$I_{220} = \beta/2 \times (Vgs-Vth)^2 \tag{3}$$

When both sides of Formula (3) above are subjected to a time derivative, Formula (4) below is obtained.

$$\Delta I_{220} = \beta \times (Vgs-Vth) \times \Delta Vgs \tag{4}$$

When Formula (4) above is rewritten with regard to $\Delta Vgs$, Formula (5) below is obtained.

$$\Delta Vgs = 1/\{\beta \times (Vgs-Vth)\} \times \Delta I_{220} \tag{5}$$

Here, a sum of current $I_{220}$ flowing through differential transistor 220 and a current $I_{221}$ flowing through differential transistor 221 is equal to current $I_{224}$ flowing through current source transistor 224. Hence, Formulas (6) and (7) below are established.

$$I_{220} + I_{221} = I_{224} \tag{6}$$

$$(I_{220} + \Delta I_{220}) + (I_{221} + \Delta I_{221}) = I_{224} \tag{7}$$

From Formulas (6) and (7) above, temporal change $\Delta I_{220}$ of current $I_{220}$ flowing through differential transistor 220 and temporal change $\Delta I_{221}$ of current $I_{221}$ flowing through differential transistor 221 have polarities reverse to each other and have a same magnitude. Hence, Formula (8) below is established.

$$\Delta I_{220} = -\Delta I_{221} \tag{8}$$

From Formulas (5) and (8) above, $\Delta Vgs$ is suppressed if $\Delta I_{221}$ is suppressed. Hence, it becomes possible to reduce the streaking.

In comparator 208A according to this exemplary embodiment, the ratio between W/L of load transistors 222 and W/L of load transistors 223 is set to M:1 (M>1). In such a way, current $I_{221}$ flowing through differential transistor 221 is decreased from ½ of usual ($I_{224}$) to 1/(1+M) (M>1). Hence, temporal change $\Delta I_{220}$ of the current flowing through differential transistor 220 is suppressed, and it becomes possible to suppress the streaking.

Moreover, the ratio between W/L of differential transistors 220 and W/L of differential transistors 221 is set to 1:N (N>1). In such a way, a capacitance of a drain portion of differential transistor 221 is increased without changing a size of differential transistor 220 that connects to the reference signal, that is, without increasing capacitance Cgs in Formula (1) above. Hence, a temporal fluctuation of Vgs of differential transistor 221, that is, a temporal fluctuation of Vgs of differential transistor 220 is relieved, whereby it becomes possible to suppress the streaking without deteriorating the noise characteristics.

In other words, there is adopted such a circuit configuration of suppressing the occurrence of the fluctuation of Vgs in the differential transistors of comparator 208A. In such a way, it becomes possible to suppress such a streaking phenomenon without increasing the size, the power consumption, and the noise.

Note that, in the above-described exemplary embodiment, there is mentioned a configuration in which only the symmetry of differential transistors 220 and 221 is disturbed (the ratio in W/L is set to 1:N (N>1)) without disturbing symmetry of load transistors 222 and 223 (while setting the ratio in W/L to 1:1). By adopting this configuration, the effect of suppressing the streaking becomes smaller than the effect in this exemplary embodiment in which both of the symmetry of load transistors 222 and 223 and the symmetry of differential transistors 220 and 221 are disturbed. However, it becomes possible to suppress the streaking by means of a small area in a case where the number of pixels is small and an operation frequency is not very high.

Moreover, in the above-described exemplary embodiment, there is mentioned a configuration in which only the symmetry of load transistors 222 and 223 is disturbed (the ratio in W/L is set to M:1 (M>1)) without disturbing the symmetry of differential transistors 220 and 221 (while setting the ratio in W/L to 1:1). By adopting this configuration, it becomes possible to suppress the streaking by means of a small area in the case where the number of pixels is small and the operation frequency is not very high.

Moreover, the solid-state image pickup device according to this exemplary embodiment may adopt any system including those of a single slope type, a sequential comparison type and others as long as including a column AD converter that supplies comparators to all of columns and uses the same. The same as above also applies to a solid-state image pickup device according to a second exemplary embodiment described later.

Moreover, the description has been made of the exemplary embodiment by referring to the NMOS differential transistors, current source transistor, and PMOS load transistors. However, solid-state image pickup device 200 according to this exemplary embodiment and the solid-state image pickup device according to the second exemplary embodiment described later may use a configuration in which the power supply and the ground as well as the NMOS and the PMOS are inverted.

Moreover, the above-described exemplary embodiment adopts a configuration in which comparator 208A used a pair of the differential transistors, a pair of the load transistors and the current source transistor. However, the solid-state image pickup device according to this exemplary embodiment may use a cascode configuration in order to increase the gain of the comparators. The same as above also applies to a solid-state image pickup device according to a second exemplary embodiment described later. Moreover, the solid-state image pickup device according to this exemplary embodiment may use a configuration of a full differential type, which is given a bias voltage, in place of such a load transistor configuration of a current mirror type. Furthermore, the solid-state image pickup device according to this exemplary embodiment may use a configuration of a cross couple type in order to realize a high-speed response. That is to say, the solid-state image pickup device according to this exemplary embodiment may use any configuration as long as the comparison operation can be performed by the differential operation.

Second Exemplary Embodiment

With regard to a configuration and operations of the solid-state image pickup device according to the second exemplary embodiment, a description is mainly made below of different points from the first exemplary embodiment while referring to the drawings.

Figure 5:
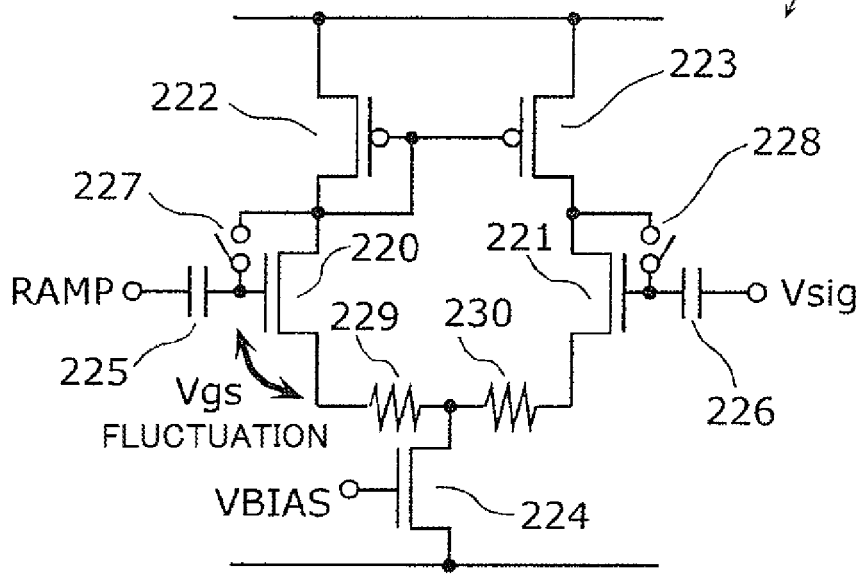
FIG. 5 is a diagram showing an example of a circuit configuration of a comparator according to a second exemplary embodiment.

FIG. 5 is a diagram showing an example of a circuit configuration of a comparator according to the second exemplary embodiment. Comparator 208B shown in FIG. 5 includes: differential transistors 220 and 221; load transistors 222 and 223; current source transistor 224; resistors 229 and 230 (at least one of resistors 229 and 230); and reset switches 227 and 228.

Differential transistors 220 and 221, load transistors 222 and 223, current source transistor 224 and reset switches 227 and 228 are similar to those of the configuration of the first exemplary embodiment.

Resistors 229 and 230 are resistor elements connected between source terminals of differential transistors 220 and 221 and a drain terminal of current source transistor 224, respectively. In other words, resistors 229 and 230 are resistance components inserted at least between the source terminal of the first differential transistor and the drain terminal of the current source transistor and between the source terminal of the second differential transistor and the drain terminal of the current source transistor.

A feature of the solid-state image pickup device according to this exemplary embodiment is that resistors 229 and 230 are added to the configuration of comparator 208A.

In accordance with this configuration, the temporal change of the current flowing through the first differential transistor is suppressed by an amount of a voltage drop in resistors 229 and 230. Following this, the fluctuation of $\Delta Vgs$ in differential transistors 220 and 221 is decreased, and accordingly, an amount of the streaking is suppressed. Moreover, high resistance is inserted between differential transistor 220 and differential transistor 221, and accordingly, isolation between differential transistor 220 and differential transistor 221 is enhanced. In such a way, a potential fluctuation of the source of differential transistor 221 is suppressed from propagating to the source of differential transistor 220. Hence, since a source fluctuation $\Delta Vs$ is decreased while the gate fluctuation $\Delta Vg$ of differential transistor 220 is left as it is, the amount of streaking is suppressed.

Figure 6:
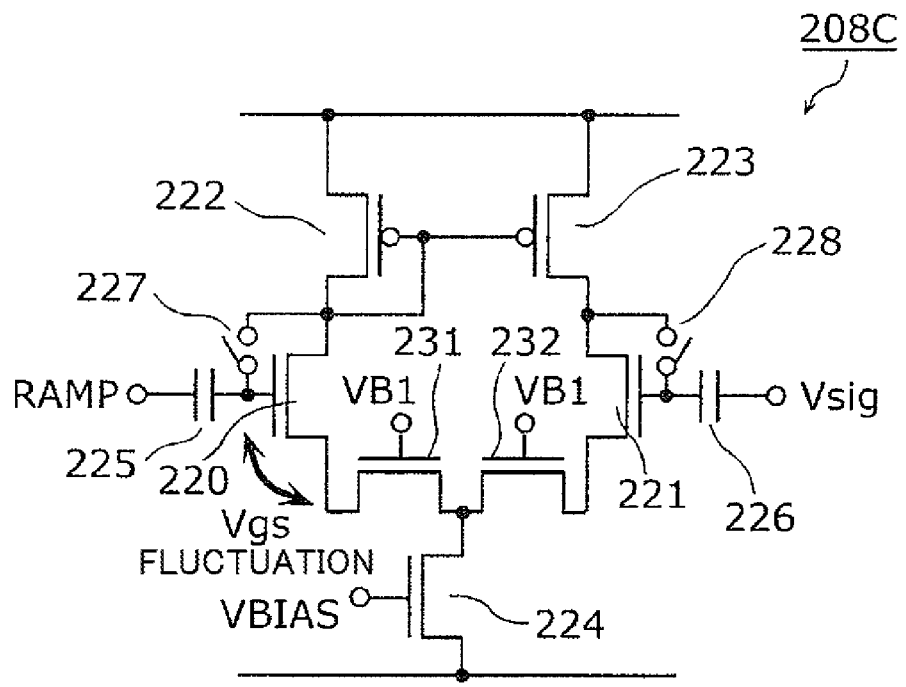
FIG. 6 is a diagram showing an example of a circuit configuration of a comparator according to a first modification example of the second exemplary embodiment.

FIG. 6 is a diagram showing an example of a circuit configuration of a comparator according to a first modification example of the second exemplary embodiment. Comparator 208C shown in FIG. 6 is different from comparator 208B according to the second exemplary embodiment only in that switches 231 and 232 are added in place of resistors 229 and 230.

Switches 231 and 232 are switch elements connected between the source terminals of differential transistors 220 and 221 and the drain terminal of current source transistor 224, respectively. In other words, switches 231 and 232 are switch elements inserted at least either between the source terminal of the first differential transistor and the drain terminal of the current source transistor or between the source terminal of the second differential transistor and the drain terminal of the current source transistor. In this modification example, resistors 229 and 230 shown in FIG. 5 are substituted for resistance components of switches 231 and 232, which are in an ON state.

That is to say, in comparator 208C according to the first modification example described above, there is adopted such a configuration of using ON resistance of switches 231 and 232 between the source terminals of the differential transistors and the drain terminal of the current source transistor. In such a way, it becomes possible to suppress the streaking by means of a small area by using the MOS switch elements.

Note that, in this exemplary embodiment, as a second modification example, there is a configuration in which resistance values of the resistor elements owned by comparator 208B shown in FIG. 5 are varied. For example, there is a configuration in which each of resistors 229 and 230 of comparator 208B is replaced by a configuration in which two or more resistors and a switch that switches a connection state of the two or more resistors are connected in parallel. That is to say, the above-described resistance components are composed of a plurality of the resistor elements connected in parallel to each other, and are made capable of switching resistance values in such a manner that connection states of the plurality of resistor elements are changed. In a similar way, there is a configuration in which each of switches 231 and 232 of comparator 208C shown in FIG. 6 is replaced by a configuration in which two or more switches are connected in parallel. In cases of these configurations, in a case of picking up a dark image, requirements for the noise characteristics are severe, and accordingly, the comparator is operated by selecting a low resistance value. Meanwhile, in a case of picking up a bright image, such streaking characteristics are conspicuous, and accordingly, the streaking is suppressed by selecting a high resistance value. In such a way, the comparator is operated by selecting the plurality of set resistance values in response to the picked-up image, whereby it becomes possible to realize image characteristics and streaking characteristics, which are optimum for each of the images.

As described above, it becomes possible to make setting that corresponds to the image, and it becomes possible to optimize characteristics of a camera system.

Note that, though the description has been made here of the switching that depends on the image, there is no restriction on a method of the optimization. For example, the switching can be made for each of product specifications.

Third Exemplary Embodiment

The solid-state image pickup devices according to the first and second exemplary embodiments are suitable for use in an imaging device (image input device) of an image pickup device such as a video camera, a digital still camera, and further, a camera module for a mobile instrument such as a cellular phone.

Figure 7:
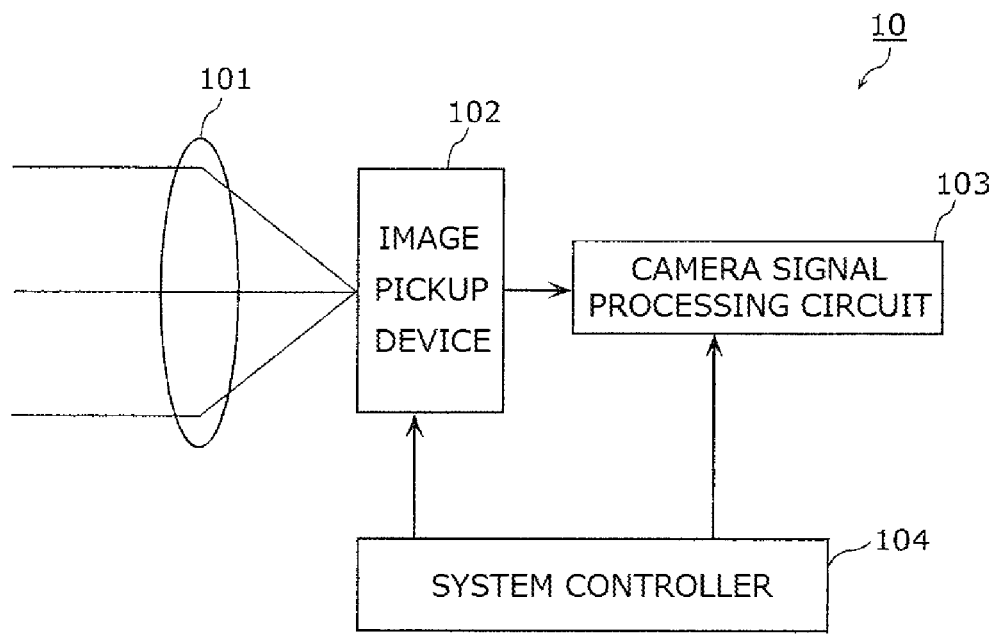
FIG. 7 is a block diagram showing an example of a configuration of an image pickup device (camera system) including the solid-state image pickup device according to the first or second exemplary embodiment.

FIG. 7 is a block diagram showing an example of a configuration of an image pickup device (camera system) including the solid-state image pickup device according to the first or second exemplary embodiment. As shown in FIG. 7, image pickup device 10 according to a third exemplary embodiment includes: lens 101; image pickup device 102; camera signal processing circuit 103; and system controller 104.

Lens 101 is an optical element for guiding incident light to an image pickup region of image pickup device 102.

Image pickup device 102 is a solid-state image pickup device according to the first or second exemplary embodiment. Image pickup device 102 outputs an image signal obtained by converting image light, which is formed as an image on an image pickup surface by lens 101, into an electrical signal per pixel.

Camera signal processing circuit 103 is a circuit that performs a variety of processing for an output signal of image pickup device 102.

System controller 104 is a controller that drives image pickup device 102 and camera signal processing circuit 103.

The image signal processed by camera signal processing circuit 103 is recorded as a still image or a moving picture on a recording medium, for example, such as a memory. Moreover, the image signal is displayed as a moving picture on a monitor including a liquid crystal display and the like.

In accordance with the image pickup device according to this exemplary embodiment, the solid-state image pickup device, which is capable of suppressing the streaking without increasing the power consumption, the noise and the area, is built therein. Accordingly, the image pickup device, which serves as a camera system, can provide a high-quality image.

Others

Note that the solid-state image pickup device and the image pickup device according to the present disclosure are not limited to the above-described exemplary embodiments. Other exemplary embodiments, which are realized by combining arbitrary constituents in the respective exemplary embodiments with one another, modification examples, which are obtained by implementing a variety of modifications conceivable by those skilled in the art for the respective exemplary embodiments within the scope without departing from the spirit of the present disclosure, and a variety of instruments, which build the solid-state image pickup device according to the present disclosure, are also incorporated in the present disclosure.

For example, in the first and second exemplary embodiments described above, there is adopted the configuration in which counters 209 are provided in the respective columns and are supplied with the counter clocks, and the counting operations in the respective columns are stopped at the inversion timing of the output of the comparators, whereby the digitization is performed. However, the present disclosure is not limited to this. Such a configuration may be adopted, in which a common counter is provided outside of the column array, respective columns include memories or latches for the A/D conversion, and a count value is distributed from the common counter commonly to all of the columns, wherein the count values of the respective columns are latched at the inversion timing of the outputs of the comparators, whereby the digitization is performed.

Moreover, the configuration of the pixel included in the image pickup region may be a configuration in which the pixels are selected by means of a floating diffusion potential without using such selection transistors. Moreover, a unit cell may be used, which shares a reset transistor and a source follower transistor by a plurality of the pixels.

Moreover, in the first to third exemplary embodiments, the description has been made of types which refer to the ramp signal of the single-slope column-parallel A/D conversion; however, the A/D conversion may be column A/D conversion of a type which supplies the reference voltage to all of the columns and uses the same (for example, sequential comparison type A/D conversion). Also in this case, a similar effect is exerted.

The present disclosure can suppress the image deterioration (streaking) at the time of the image pickup without increasing the power consumption, the noise and the area. For example, the present disclosure can be applied to a variety of camera systems such as a CMOS solid-state image pickup device, a digital still camera, a movie camera, cellular phone added with a camera, a surveillance camera, an on-board camera and a medical camera.

What is claimed is:
1. A solid-state image pickup device comprising:
a pixel portion in which a plurality of pixels performing photoelectric conversion are arrayed in matrix; and
an Analog-Digital converter that converts pixel signals, which are generated in the pixel portion, from analog signals into digital signals,
wherein the Analog-Digital converter includes:
a comparator which is disposed for each of pixel columns and compares the analog signals, each of which corresponds to each of the plurality of pixels, with a reference signal; and
a counter which is disposed so as to correspond to the comparator and obtains the digital signals by counting periods during which the comparator compares the analog signals with the reference signal,
the comparator includes:
a first differential transistor to which the reference signal is input;
a second differential transistor to which the analog signals are input;
a first load transistor connected between a drain terminal of the first differential transistor and a power supply;
a second load transistor connected between a drain terminal of the second differential transistor and the power supply; and
a current source transistor connected between a ground and source terminals of the first differential transistor and the second differential transistor, wherein a fluctuation of a voltage between a gate and a source of the first differential transistor is suppressed, the fluctuation following a voltage fluctuation of a node connected commonly to the second differential transistor and the second load transistor, and wherein a ratio between gate width/gate length of the first differential transistor and gate width/gate length of the second differential transistor is 1:N (N>1).

2. The solid-state image pickup device according to claim 1, wherein a ratio between gate width/gate length of the first load transistor and gate width/gate length of the second load transistor is M:1 (M>1).

3. A solid-state image pickup device comprising:
a pixel portion in which a plurality of pixels performing photoelectric conversion are arrayed in matrix; and
an Analog-Digital converter that converts pixel signals, which are generated in the pixel portion, from analog signals into digital signals,
wherein the Analog-Digital converter includes:
a comparator which is disposed for each of pixel columns and compares the analog signals, each of which corresponds to each of the plurality of pixels, with a reference signal; and
a counter which is disposed so as to correspond to the comparator and obtains the digital signals by counting periods during which the comparator compares the analog signals with the reference signal,
the comparator includes:
a first differential transistor to which the reference signal is input;
a second differential transistor to which the analog signals are input;
a first load transistor connected between a drain terminal of the first differential transistor and a power supply;
a second load transistor connected between a drain terminal of the second differential transistor and the power supply; and
a current source transistor connected between a ground and source terminals of the first differential transistor and the second differential transistor,
wherein a fluctuation of a voltage between a gate and a source of the first differential transistor is suppressed, the fluctuation following a voltage fluctuation of a node connected commonly to the second differential transistor and the second load transistor, and
wherein a ratio between gate width/gate length of the first load transistor and gate width/gate length of the second load transistor is M:1 (M>1).

4. A solid-state image pickup device comprising:
a pixel portion in which a plurality of pixels performing photoelectric conversion are arrayed in matrix; and
an Analog-Digital converter that converts pixel signals, which are generated in the pixel portion, from analog signals into digital signals,
wherein the Analog-Digital converter includes:
a comparator which is disposed for each of pixel columns and compares the analog signals, each of which corresponds to each of the plurality of pixels, with a reference signal; and
a counter which is disposed so as to correspond to the comparator and obtains the digital signals by counting periods during which the comparator compares the analog signals with the reference signal,
the comparator includes:
a first differential transistor to which the reference signal is input;
a second differential transistor to which the analog signals are input;
a first load transistor connected between a drain terminal of the first differential transistor and a power supply:
a second load transistor connected between a drain terminal of the second differential transistor and the power supply; and
a current source transistor connected between a ground and source terminals of the first differential transistor and the second differential transistor,
wherein a fluctuation of a voltage between a gate and a source of the first differential transistor is suppressed, the fluctuation following a voltage fluctuation of a node connected commonly to the second differential transistor and the second load transistor, and
wherein a resistance component is inserted at least either between the source terminal of the first differential transistor and a drain terminal of the current source transistor or between the source terminal of the second differential transistor and the drain terminal of the current source transistor.

5. The solid-state image pickup device according to claim 4, further comprising:
a switch element inserted at least either between the source terminal of the first differential transistor and the drain terminal of the current source transistor or between the source terminal of the second differential transistor and the drain terminal of the current source transistor,
wherein the resistance component is a resistance component in an ON state of the switch element.

6. The solid-state image pickup device according to claim 4, wherein the resistance component includes a plurality of resistor elements connected in parallel to each other, and is capable of switching a resistance value by a change in a connection state of the plurality of resistor elements.

7. An image pickup device comprising:
the solid-state image pickup device according to claim 1; and
an optical system that forms a subject image as an image on the pixel portion.

* * * * *